United States Patent
Kato

(10) Patent No.: US 7,038,525 B2
(45) Date of Patent: May 2, 2006

(54) ANALOG SWITCHING CIRCUIT AND GRADATION SELECTOR CIRCUIT

(75) Inventor: Fumihiko Kato, Yamagata (JP)

(73) Assignee: NEC Electronics Corporation, Kanagawa (JP)

( * ) Notice: Subject to any disclaimer, the term of this patent is extended or adjusted under 35 U.S.C. 154(b) by 20 days.

(21) Appl. No.: 10/436,151

(22) Filed: May 13, 2003

(65) Prior Publication Data

US 2003/0214343 A1    Nov. 20, 2003

(30) Foreign Application Priority Data

May 20, 2002  (JP)  ............................. 2002-145364

(51) Int. Cl.
*H03K 17/687*    (2006.01)
(52) U.S. Cl. ..................... 327/437; 327/436; 327/404
(58) Field of Classification Search ............... 327/403, 327/404, 407, 408, 534, 535, 537, 427, 581, 327/434–437; 326/113
See application file for complete search history.

(56) References Cited

U.S. PATENT DOCUMENTS 4,529,897 A * 7/1985 Suzuki et al. ............... 327/437
4,590,396 A * 5/1986 Koike ............................ 326/24
6,348,831 B1 * 2/2002 Baba .......................... 327/537

FOREIGN PATENT DOCUMENTS

| JP | S58-171126 A | 10/1983 |
| JP | H07-079145 A | 3/1995 |
| JP | 2000-77992 A | 3/2000 |

* cited by examiner

Primary Examiner—Long Nguyen
(74) Attorney, Agent, or Firm—Sughrue Mion, PLLC

(57) ABSTRACT

A gradation selector circuit provided with a resistor string circuit in which resistive elements are connected in series between a high potential power source and a low potential power source and a selector circuit which is connected to the resistor string circuit, which selects one of plural analog voltages generated in the resistor string circuit according to a control signal and which outputs it to an output terminal is used. The selector circuit includes analog switching circuits that select analog voltage close to intermediate potential. The analog switching circuit includes a P-type MOS transistor to the source electrode and the back gate electrode of which the resistor string circuit is connected and a depletion type N-type MOS transistor to the source electrode of which the drain electrode of the P-type MOS transistor is connected and to the drain electrode of which an output terminal is connected.

14 Claims, 7 Drawing Sheets

ANALOG SWITCHING CIRCUIT AND GRADATION SELECTOR CIRCUIT

BACKGROUND OF THE INVENTION

1. Field of the Invention

The present invention relates to an analog switching circuit and a gradation selector circuit, particularly relates to an analog switching circuit and a gradation selector circuit used for selectively outputting one of plural analog voltage values.

2. Description of the Related Art

A gradation selector circuit that selectively outputs one of plural analog voltage values according to a control signal is known. The conventional type gradation selector circuit will be described below.

FIG. 6 is a circuit diagram showing the configuration of the conventional type gradation selector circuit. The conventional type gradation selector circuit 110 is provided with a resistor string circuit (a ladder resistor circuit) 114 and a selector circuit 111.

The resistor string circuit 114 is formed by connecting resistive elements R in series between a high potential power source and a low potential power source.

The selector circuit 111 includes plural analog switching circuits 111a, 111b, 111c, - - - each of which is connected between a node of each resistive element R of the resistor string circuit 114 and the output terminal of the gradation selector circuit 110.

In the gradation selector circuit 110, the node of each resistive element R of the resistor string circuit 114 has analog voltage acquired by dividing voltage between the high potential power source and the low potential power source by the number of the resistive elements R.

In the selector circuit 111, only one of the plural analog switching circuits 111a, 111b, 111c, - - - is selected and is turned on according to input data (an input control signal). Analog voltage applied to the corresponding node of the selected analog switching circuit 111x (x=a, b, c, - - - ) is output from the output terminal of the gradation selector circuit 110.

In the conventional type gradation selector circuit 110, for the analog switching circuit, for example, the analog switching circuits 111a, 111b, 111c, - - - in each of which an N-type insulated gate field effect transistor (hereinafter called an N-type MOS transistor) and a P-type insulated gate field effect transistor (hereinafter called a P-type MOS transistor) are connected in parallel are used.

In the prior art shown in FIG. 6, potential difference is made between the potential of a source electrode which is one electrode of the source and the drain of each transistor in the analog switching circuit 111a for example and the potential of a back gate electrode. Therefore, the threshold voltage of the MOS transistor increases by back gate effect. As the voltage of the analog switching circuit 111a, - - - approaches analog voltage in the vicinity of intermediate potential, ON-state resistance increases, acting speed is slowed and an error among voltage output from the output terminal of the gradation selector circuit 110 is increased.

To avoid the problem, there are a method of controlling a threshold and a method of changing the size of a transistor, however, in both cases, the cost of the chip is increased.

For related technique, the technique of an analog switch is disclosed in Japanese published unexamined patent application No. 2000-77992. FIG. 7 is a circuit diagram showing the configuration of one example of an analog switch 120 used for a gradation selector circuit disclosed in the patent application.

In an analog switch 121, an N-type MOS transistor 123, an N-type MOS transistor 125 and an N-type MOS transistor 127 are connected. The N-type MOS transistor 123 is connected between a first terminal and a second terminal. The N-type MOS transistor 125 is connected between the first terminal and the back gate electrode of the N-type MOS transistor 123. The N-type MOS transistor 127 is connected between the back gate electrode of the N-type MOS transistor 123 and a low potential power source.

In an analog switch 122, a P-type MOS transistor 124, a P-type MOS transistor 126 and a P-type MOS transistor 128 are connected. The P-type MOS transistor 124 is connected between a first terminal and a second terminal. The P-type MOS transistor 126 is connected between the first terminal and the back gate electrode of the P-type MOS transistor 124. The P-type MOS transistor 128 is connected between the back gate electrode of the P-type MOS transistor 124 and a high potential power source.

These two analog switches 121, 122 are connected in parallel and compose the analog switch 120 shown in FIG. 7.

The first terminal is connected to the resistor string circuit (the ladder resistor circuit) 114 shown in FIG. 6 and the second terminal is connected to the output terminal.

In case the analog switch 120 is turned on, the source electrode of each transistor and the back gate electrode of each transistor are at the same potential via the N-type MOS transistor 125 and the P-type MOS transistor 126. Therefore, the increase of threshold voltage by back gate effect can be inhibited. The ON-state resistance of each transistor corresponding to analog voltage in the vicinity of intermediate voltage can be reduced.

Besides, in case the analog switch 120 is turned off, leakage current when the first terminal and the second terminal are at different potential can be inhibited because the back gate electrode of each transistor is connected to the high potential power source and the low potential power source via the N-type MOS transistor 127 and the P-type MOS transistor 128.

The acting speed is accelerated and the precision of output voltage can be enhanced by adopting the configuration described above.

In this technique, in a process in which the threshold voltage of a transistor is set to a high value or in case the use at low voltage is required, a case that the N-type MOS transistor 125 or the P-type MOS transistor 126 cannot be fully turned on occurs. As a result, the source electrode which is one electrode of the source and the drain of the N-type MOS transistor 123 or the P-type MOS transistor 124 and the back gate electrode of the same transistor are not at the same potential and as a result, a case that the ON-state resistance of the analog switch 120 never drops occurs.

SUMMARY OF THE INVENTION

Therefore, the object of the invention is to provide an analog switching circuit and a gradation selector circuit wherein the ON-state resistance can be also lowered in a process in which the threshold voltage of a transistor is high and in case circuit design at low voltage is required.

Another object of the invention is to provide an analog switching circuit and a gradation selector circuit wherein high-speed operation is also enabled in a process in which the threshold voltage of a transistor is high and in case circuit design at low voltage is required.

Further another object of the invention is to provide an analog switching circuit and a gradation selector circuit wherein the precision of output voltage is also high in a process in which the threshold voltage of a transistor is high and in case circuit design at low voltage is required.

The furthermore another object of the invention is to provide an analog switching circuit and a gradation selector circuit wherein the objects described above can be realized, inhibiting the increase of the cost of a chip.

Means to solve the problem will be described using reference numbers which will be used in embodiments of the invention below. Parentheses are added to these reference numbers to clarify correspondence between description in claims and the detailed description of embodiments. However, it is natural that the reference numbers should not be used for the interpretation of the technical scope of the invention described in the claims.

Besides, in this specification including the item of means to solve the problem and the item of preferred embodiments, one electrode of the source and the drain of a P-type MOS transistor and an N-type MOS transistor shall be a source electrode and the other electrode of the source and the drain shall be a drain electrode.

In the invention, to solve the problem, the analog switching circuit according to the invention is provided with an enhancement type P-type MOS transistor (22) and a depletion type N-type MOS transistor (23).

For the P-type MOS transistor (22), the input terminal is connected to a source electrode and a back gate electrode and a first control signal (Φ−) is input to a gate electrode. For the depletion type N-type MOS transistor (23), the drain electrode of the P-type MOS transistor (22) is connected to a source electrode, the output terminal is connected to a drain electrode and a second control signal (Φ) of reverse polarity to the first control signal (Φ−) is input to a gate electrode.

The input terminal is connected to a node at which analog voltage close to intermediate potential is generated out of plural nodes at which different analog voltage between high potential and low potential is generated.

As the input terminal is connected to both the source electrode and the back gate electrode in the P-type MOS transistor (22), the ON-state resistance is small enough for analog voltage close to intermediate potential to turn on the transistor.

Besides, the analog switching circuit according to the invention is provided with an enhancement type N-type MOS transistor (32) and a depletion type P-type MOS transistor (33).

For the N-type MOS transistor (32), the input terminal is connected to the source electrode and the back gate electrode and a second control signal (Φ) is input to the gate electrode. For the depletion type P-type MOS transistor (33), the drain electrode of the N-type MOS transistor (32) is connected to the source electrode, the output terminal is connected to the drain electrode and a first control signal (Φ−) of reverse polarity to the second control signal (Φ) is input to the gate electrode.

The input terminal is connected to a node at which analog voltage close to intermediate potential is generated out of plural nodes at which different analog voltage between high potential and low potential is generated.

As in the N-type MOS transistor (32), the input terminal is connected to both the source electrode and the back gate electrode, the ON-state resistance is small enough for analog voltage close to intermediate potential to turn on the transistor.

Further, the analog switching circuit according to the invention is provided with an enhancement type first P-type MOS transistor (42), a depletion type N-type MOS transistor (43) and an enhancement type second P-type MOS transistor (44).

For the first P-type MOS transistor (42), the input terminal is connected to the source electrode, the output terminal is connected to the drain electrode and a first control signal (Φ−) is input to the gate electrode. For the depletion type N-type MOS transistor (43), the input terminal is connected to the source electrode, the back gate electrode of the first P-type MOS transistor (42) is connected to the drain electrode and a second control signal (Φ) of reverse polarity to the first control signal (Φ−) is input to the gate electrode. For the second P-type MOS transistor (44), a high potential power source ($V_H$) is connected to the source electrode and the back gate electrode, the back gate electrode of the first P-type MOS transistor (42) is connected to the drain electrode and a second control signal (Φ) is input to the gate electrode.

The input terminal is connected to a node at which analog voltage close to intermediate potential is generated out of plural nodes at which different analog voltage between high potential and low potential is generated.

As in the first P-type MOS transistor (42), the input terminal is connected to both the source electrode and the back gate electrode via the depletion type N-type MOS transistor (43), the ON-state resistance is small enough for analog voltage close to intermediate potential to turn on the transistor.

Further, the analog switching circuit according to the invention is provided with an enhancement type first N-type MOS transistor (52), a depletion type P-type MOS transistor (53) and an enhancement type second N-type MOS transistor (54).

For the first N-type MOS transistor (52), the input terminal is connected to the source electrode, the output terminal is connected to the drain electrode and a second control signal (Φ) is input to the gate electrode. For the depletion type P-type MOS transistor (53), the input terminal is connected to the source electrode, the back gate electrode of the first N-type MOS transistor (52) is connected to the drain electrode and a first control signal (Φ−) of reverse polarity to the second control signal (Φ) is input to the gate electrode. For the second N-type MOS transistor (54), a low potential power source ($V_L$) is connected to the source electrode and the back gate electrode, the back gate electrode of the first N-type MOS transistor (52) is connected to the drain electrode and a first control signal (Φ−) is input to the gate electrode.

The input terminal is connected to a node at which analog voltage close to intermediate potential is generated out of plural nodes at which different analog voltage between high potential and low potential is generated.

As in the first N-type MOS transistor (52), the input terminal is connected to both the source electrode and the back gate electrode via the depletion type P-type MOS transistor (53), the ON-state resistance is small enough for analog voltage close to intermediate potential to turn on the transistor.

To solve the before-mentioned problem, the gradation selector circuit according to the invention is provided with a resistor string circuit (a ladder resistor circuit) (14) and a selector circuit (19).

The resistor string circuit (14) is connected in series between the high potential power source and the low potential power source. The selector circuit (19) is connected to the resistor string circuit (14), selects one of plural analog voltage generated in the resistor string circuit (14) according to a control signal (Φ/Φ−) and outputs it to an output terminal. The selector circuit (19) is provided with plural analog switching circuits 11, 12, 13, - - - as plural transistor switches corresponding to plural analog voltage values. These analog switching circuits are composed of 11-1, 11-2, 11-3 or 11-4.

The analog switching circuit (11-1, 11-2, 11-3 or 11-4) that selects analog voltage close to intermediate potential out of plural analog voltage has small ON-state resistance enough for analog voltage close to intermediate potential to turn on.

The gradation selector circuit according to the present invention is also characterized in that the analog switching circuit (11-1) that selects analog voltage close to intermediate potential is provided with a P-type MOS transistor (22) and a depletion type N-type MOS transistor (23).

For the P-type MOS transistor (22), the resistor string circuit (14) is connected to the source electrode and the back gate electrode and a first control signal (Φ−) is input to the gate electrode. For the depletion type N-type MOS transistor (23), the drain electrode of the P-type MOS transistor (22) is connected to the source electrode, the output terminal is connected to the drain electrode and a second control signal (Φ) of reverse polarity to the first control signal (Φ−) is input to the gate electrode.

The gradation selector circuit according to the invention is also characterized in that the analog switching circuit (11-2) that selects analog voltage close to intermediate potential is provided with an N-type MOS transistor (32) and a depletion type P-type MOS transistor (33). For the N-type MOS transistor (32), the resistor string circuit (14) is connected to the source electrode and the back gate electrode and a second control signal (Φ) is input to the gate electrode. For the depletion type P-type MOS transistor (33), the drain electrode of the N-type MOS transistor (32) is connected to the source electrode, the output terminal is connected to the drain electrode and a first control signal (Φ−) of reverse polarity to the second control signal (Φ) is input to the gate electrode.

Further, the gradation selector circuit according to the invention is characterized in that the analog switching circuit (11-3) that selects analog voltage close to intermediate potential is provided with a first P-type MOS transistor (42), a depletion type N-type MOS transistor (43) and a second P-type MOS transistor (44).

For the first P-type MOS transistor (42), the resistor string circuit (14) is connected to the source electrode, the output terminal is connected to the drain electrode and a first control signal (Φ−) is input to the gate electrode. For the depletion type N-type MOS transistor (43), the resistor string circuit (14) is connected to the source electrode, the back gate electrode of the first P-type MOS transistor (42) is connected to the drain electrode and a second control signal (Φ) of reverse polarity to the first control signal (Φ−) is input to the gate electrode. For the second P-type MOS transistor (44), the high potential power source ($V_H$) is connected to the source electrode and the back gate electrode, the back gate electrode of the first P-type MOS transistor (42) is connected to the drain electrode and a second control signal (Φ) is input to the gate electrode.

Further, the gradation selector circuit according to the invention is characterized in that the analog switching circuit (11-4) that selects analog voltage close to intermediate potential is provided with a first N-type MOS transistor (52), a depletion type P-type MOS transistor (53) and a second N-type MOS transistor (54).

For the first N-type MOS transistor (52), the resistor string circuit (14) is connected to the source electrode, the output terminal is connected to the drain electrode and a second control signal (Φ) is input to the gate electrode. For the depletion type P-type MOS transistor (53), the resistor string circuit (14) is connected-to the source electrode, the back gate electrode of the first N-type MOS transistor (52) is connected to the drain electrode and a first control signal (Φ−) of reverse polarity to the second control signal (Φ) is input to the gate electrode. For the second N-type MOS transistor (54), the low potential power source ($V_L$) is connected to the source electrode and the back gate electrode, the back gate electrode of the first N-type MOS transistor (52) is connected to the drain electrode and a first control signal (Φ-) is input to the gate electrode.

DETAILED DESCRIPTION OF THE PREFERRED EMBODIMENTS

Referring to the attached drawings, embodiments of a gradation selector circuit according to the present invention will be described below. The same reference number is allocated to the same or the similar part in each embodiment.

Figure 1:
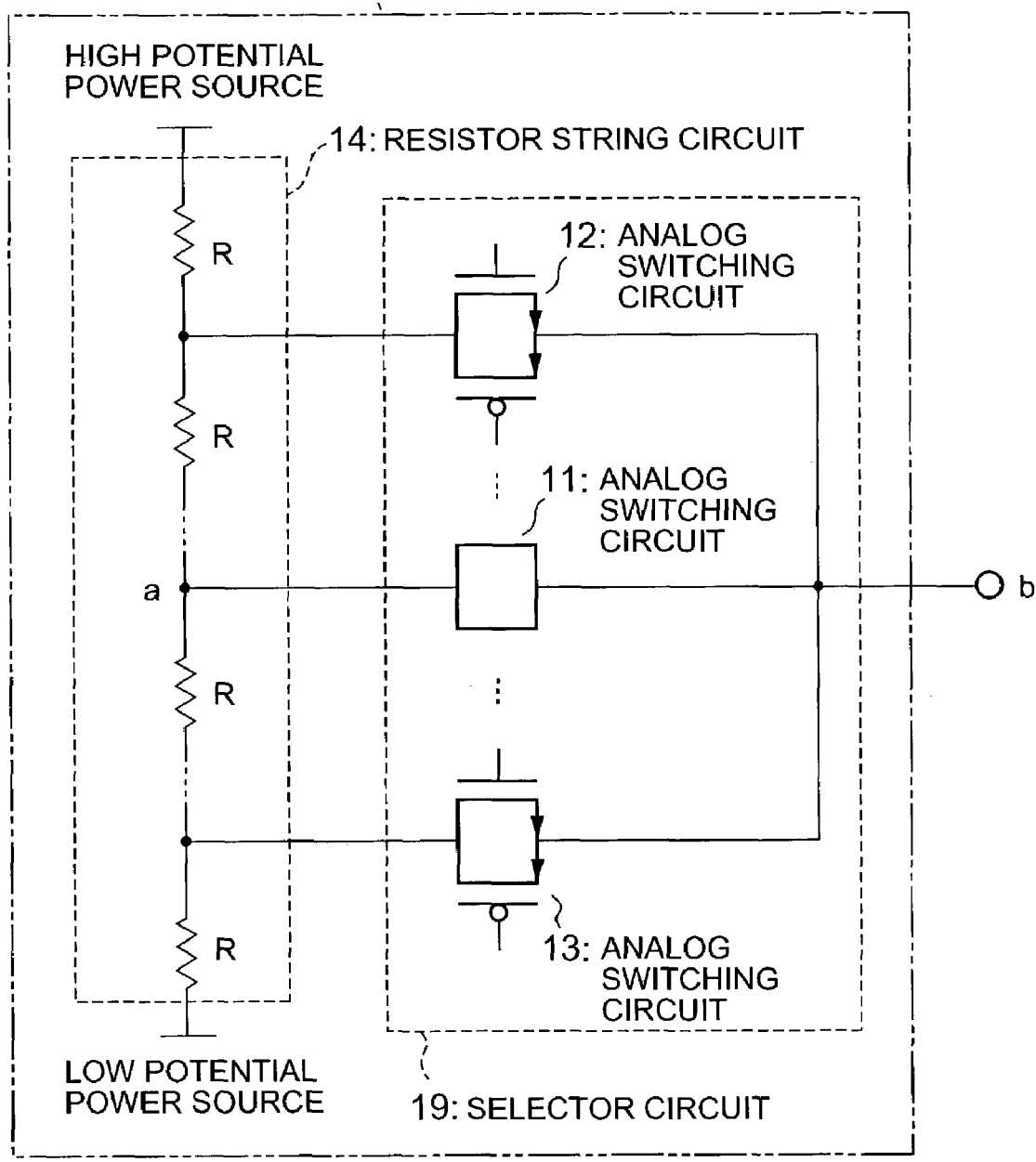
FIG. 1 is a block diagram showing the configuration of an embodiment of a gradation selector circuit according to the present invention.

FIG. 1 is a block diagram showing the configuration of an embodiment of the gradation selector circuit according to the present invention. The gradation selector circuit 10 is provided with a resistor string circuit (a ladder resistor circuit) 14 and a selector circuit 19.

The resistor string circuit (the ladder resistor circuit) 14 is formed by connecting resistive elements R in series between a high potential power source and a low potential power source. The voltage of the high potential power source and the low potential power source, the magnitude and the number of resistive elements R are designed according to the application of the gradation selector circuit.

The selector circuit 19 is provided with plural analog switching circuits 12, plural analog switching circuits 11 and plural analog switching circuits 13.

Each input side of the plural analog switching circuits 12 is connected to each node where generated analog voltage is at high potential out of nodes of each resistive element R of the resistor string circuit 14. Each output side is connected to the output terminal of the gradation selector circuit 10. In FIG. 1, only one of the analog switching circuits 12 is shown. An analog switching circuit which has been used (for example, an N-type MOS transistor and a P-type MOS transistor are connected in parallel) can be used for the plural analog switching circuits 12.

Each input side of the plural analog switching circuits 11 is connected to each node where generated analog voltage is at intermediate potential out of nodes of each resistive element R of the resistor string circuit 14. Each output side is connected to the output terminal of the gradation selector circuit 10. In FIG. 1, only one of the analog switching circuits 11 is shown. The details of the analog switching circuit 11 of the present invention will be described later.

Each input side of the plural analog switching circuits 13 is connected to each node where generated analog voltage is at low potential out of nodes of each resistive element R of the resistor string circuit 14. Each output side is connected to the output terminal of the gradation selector circuit 10. In FIG. 1, only one of the analog switching circuits 13 is shown. An analog switching circuit which has been used (for example, an N-type MOS transistor and a P-type MOS transistor are connected in parallel) can be used for the plural analog switching circuits 13.

In the gradation selector circuit 10, analog voltage acquired by dividing voltage between the high potential power source and the low potential power source by the number of each resistive element R is generated at a node of each resistive element R of the resistor string circuit 14.

Only one of the plural analog switching circuits 11, 12, 13 is turned on. Out of analog voltage generated at each node, only analog voltage corresponding to the turned-on analog switching circuit is output from the output terminal of the gradation selector circuit 10.

High potential/intermediate potential/low potential analog voltage is acquired by dividing voltage from the voltage of the high potential power source to the voltage of the low potential power source in three to be high potential, intermediate potential and low potential in order from the side of the high potential power source. The analog voltage is divided in three or in substantially three or the number of division is determined according to simulation or the result of experiments every element of the gradation selector circuit 10.

The plural analog switching circuits 11 of the present invention will be further described below.

Figure 2:
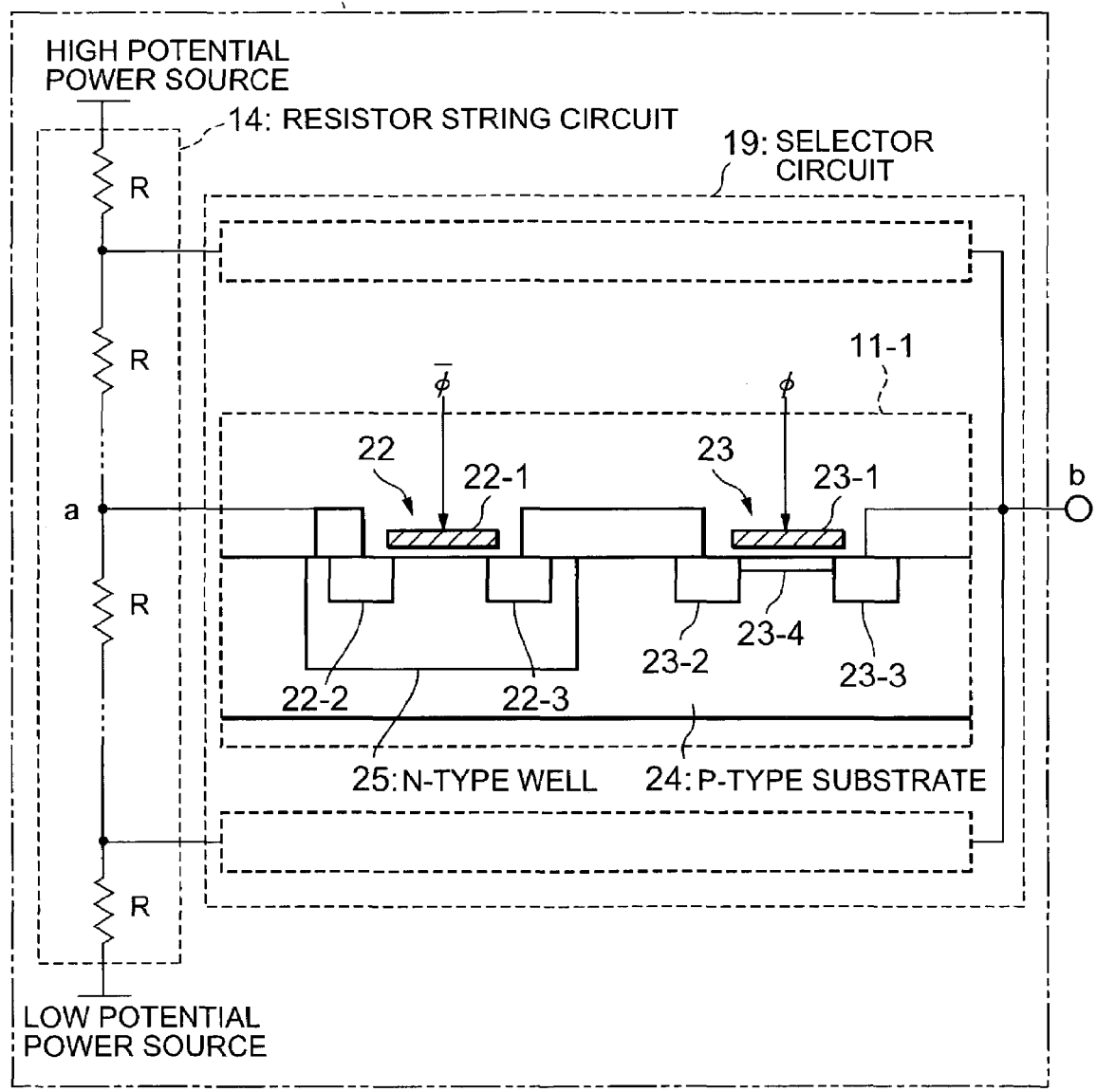
FIG. 2 mainly shows an analog switching circuit equivalent to a first embodiment of the present invention.

FIG. 2 is a circuit diagram showing the analog switching circuit which is a main part of the first embodiment of the present invention.

The gradation selector circuit 10 is provided with the resistor string circuit (the ladder resistor circuit) 14 and the selector circuit 19. The selector circuit 19 is provided with plural analog switching circuits 11-1 which are the plural analog switching circuits 11 (in FIG. 2, one analog switching circuit 11-1 is shown). As the other configuration is similar to that in FIG. 1, the description is omitted.

The analog switching circuit 11-1 is provided with an enhancement type P-type MOS transistor 22 and a depletion type N-type MOS transistor 23.

For the P-type MOS transistor 22, anode "a" of the resistor string circuit 14 is connected to a source electrode (joined to a source 22-2) and a back gate electrode (joined to an N-type well 25). A first control signal Φ– is input to a gate electrode (joined to a gate 22-1). Now, "-" of "Φ–" is added over Φ in FIG. 2 (also similar in another location and other drawings in this specification).

For the depletion type N-type MOS transistor 23, the drain electrode (joined to a drain 22-3) of the P-type MOS transistor 22 is connected to the source electrode (joined to a source 23-2). An output terminal "b" is connected to the drain electrode (joined to a drain 23-3). A second control signal Φ which is an inversed signal of reverse polarity to the first control signal Φ– is input to the gate electrode (joined to a gate 23-1).

Next, referring to FIG. 2, the operation of the first embodiment of the gradation selector circuit according to the present invention will be described.

(1) In case the second control signal Φ is at a high level:

In case the second control signal Φ is at a high level, both the P-type MOS transistor (controlled by the first control signal Φ–) and the depletion type N-type MOS transistor 23 (controlled by the second control signal Φ) are turned on.

In that case, no potential difference is made between the back gate electrode and the source electrode of the P-type MOS transistor 22. Therefore, as the rise of the threshold voltage of the P-type MOS transistor 22 by back gate effect does not occur, the rise of ON-state resistance does not also occur as a result.

Further, as the threshold voltage of the depletion type N-type MOS transistor 23 is 0 V or less, no voltage drop for the threshold voltage occurs in the depletion type N-type MOS transistor 23. Therefore, the analog switching circuit 11-1 can output high-precision voltage.

That is, the analog switching circuit 11-1 can output high-precision voltage the ON-state resistance of which is small.

(2) In case the second control signal Φ is at a low level:

When the second control signal Φ is at a low level, both the P-type MOS transistor 22 and the depletion type N-type MOS transistor 23 are turned off.

In case the back gate electrode is connected to the source electrode of the P-type MOS transistor and the potential of the drain electrode is higher than that of the source electrode, current flows in a forward direction in a PN junction and leakage current flows to the source electrode and the drain electrode. However, in the present invention, as the depletion type N-type MOS transistor 23 is connected in series, the leakage current can be prevented.

In the meantime, in case the potential of the output terminal has a value close to a low level even if the potential of the gate electrode of the depletion type N-type MOS transistor 23 is at a low level, the depletion type N-type MOS transistor 23 is turned on state. However, the P-type MOS transistor is in off state when the transistor has a value close to the low level even if the back gate electrode is connected to the source electrode.

Therefore, the P-type MOS transistor 22 and the depletion type N-type MOS transistor 23 according to the present invention complement mutual OFF-state resistance.

Therefore, ON-state resistance is reduced and leakage current can be prevented. High-speed operation and operation by high-precision output voltage can be executed.

The number of elements is not increased and the similar control signal is used, compared with the conventional type. That is, the gradation selector circuit provided with the analog switching circuit the rise of the cost of the chip of which is inhibited and which has the characteristics described above can be realized.

Figure 3:
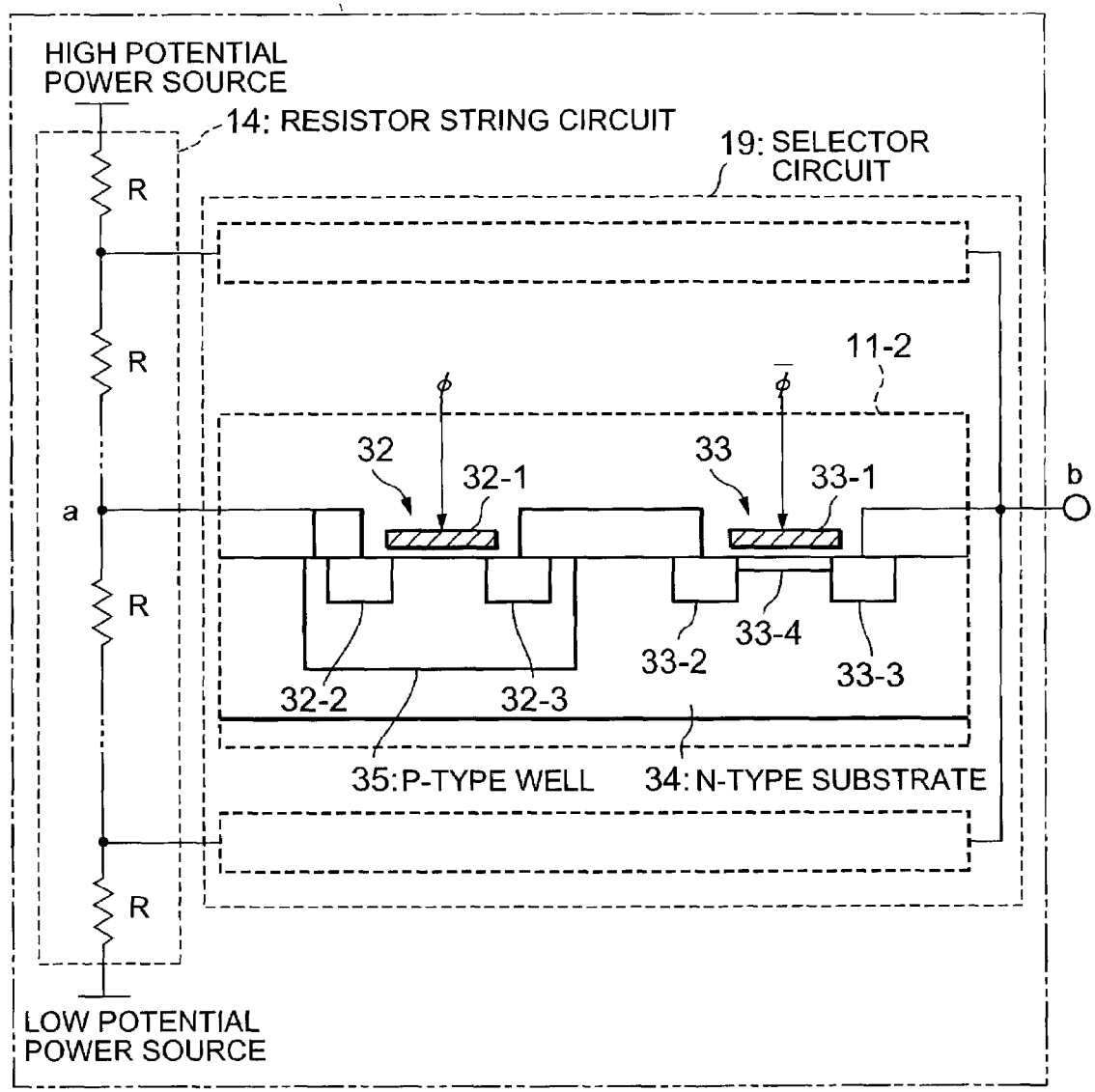
FIG. 3 mainly shows an analog switching circuit equivalent to a second embodiment of the present invention.

In case an N-type substrate is used for the P-type substrate in the analog switching circuit 11-1 shown in FIG. 2, the effect described above can be also similarly acquired. FIG. 3 shows the example as a second embodiment of the present invention.

FIG. 3 shows the gradation selector circuit 10 shown in FIG. 1 including the substantial cross section of one of plural analog switching circuits 11. The plural analog switching circuits 11 are analog switching circuits 11-2 (one analog switching circuit 11-2 is shown in FIG. 3) in case an N-type substrate is used in place of the P-type substrate used in the analog switching circuit 11-1 shown in FIG. 2.

The analog switching circuit 11-2 is provided with an enhancement type N-type MOS transistor 32 and a depletion type P-type MOS transistor 33.

For the N-type MOS transistor 32, a node a of the resistor string circuit 14 is connected to a source electrode (joined to a source 32-2) and a back gate electrode (joined to a P-type well 35). A second control signal Φ is input to a gate electrode (joined to a gate 32-1).

In a depletion type P-type MOS transistor 33, the drain electrode (joined to a drain 32-3) of an N-type MOS transistor 32 is connected to the source electrode (joined to a source 33-2). An output terminal b is connected to the drain electrode (joined to a drain 33-3). A first control signal Φ− is input to the gate electrode (joined to a gate 33-1).

The description of the operation of the gradation selector circuit 10 shown in FIG. 3 is omitted because the second embodiment is the case that the N-type substrate is used in place of the P-type substrate shown in FIG. 2.

Next, referring to FIG. 4, a third embodiment of the present invention will be described.

Figure 4:
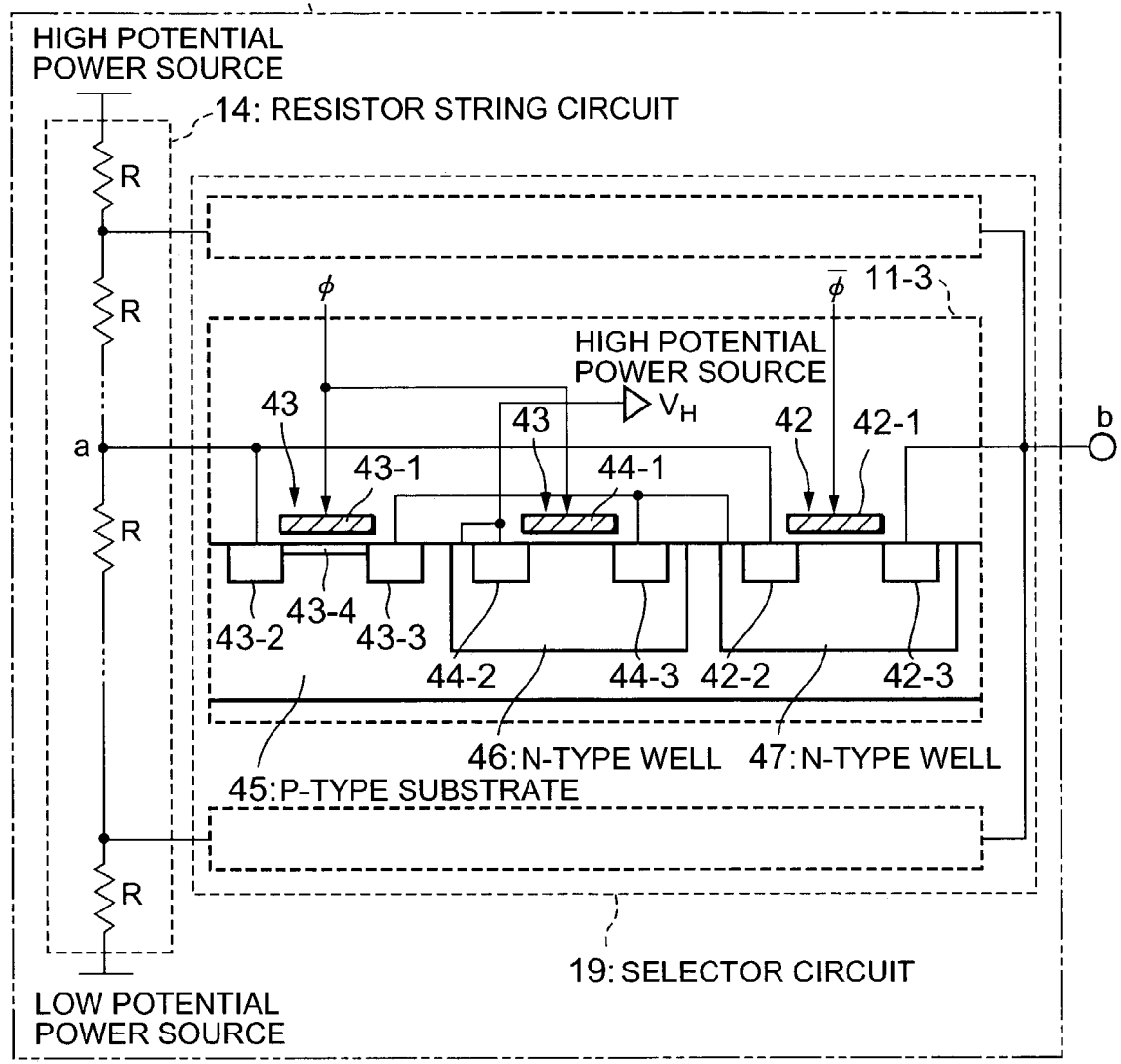
FIG. 4 mainly shows an analog switching circuit equivalent to a third embodiment of the invention.

FIG. 4 shows the gradation selector circuit 10 shown in FIG. 1 including the substantial cross section of one of plural analog switching circuits 11. The gradation selector circuit 10 is provided with the resistor string circuit (the ladder resistor circuit) 14 and the selector circuit 19. The selector circuit 19 is provided with plural analog switching circuits 11-3 which are the plural analog switching circuits 11 (in FIG. 4, one analog switching circuit 11-3 is shown). As the other configuration is similar to that in FIG. 1, the description is omitted.

An analog switching circuit 11-3 is provided with an enhancement type first P-type MOS transistor 42, a depletion type N-type MOS transistor 43 and an enhancement type second P-type MOS transistor 44.

For the first P-type MOS transistor 42, the node a of the resistor string circuit 14 is connected to the source electrode (joined to a source 42-2). An output terminal b is connected to the drain electrode (joined to a drain 42-3). A first control signal Φ− is input to the gate electrode (joined to a gate 42-1).

For the depletion type N-type MOS transistor 43, the node a of the resistor string circuit 14 is connected to the source electrode (joined to a source 43-2). The back gate electrode (joined to an N-type well 47) of the first P-type MOS transistor 42 is connected to the drain electrode (joined to a drain 43-3). A second control signal Φ which is an inverted signal (having reverse polarity) of the first control signal Φ− is input to the gate electrode (joined to a gate 43-1).

For the second P-type MOS transistor 44, the high potential power source ($V_H$) is connected to the source electrode (joined to a source 44-2) and the back gate electrode (joined to an N-type well 46). The back gate electrode of the first P-type MOS transistor 42 is connected to the drain electrode (joined to a drain 44-3). A second control signal Φ is input to the gate electrode (joined to a gate 44-1).

The potential of the high potential power source $V_H$ shall be higher than maximum potential estimated as the potential of the source electrode of the first P-type MOS transistor 42 in case the second control signal Φ is at a low level.

Next, referring to FIG. 4, the operation of the third embodiment of the gradation selector circuit according to the present invention will be described.

(1) In case the second control signal Φ is at a high level:

In case the second control signal Φ is at a high level, the depletion type N-type MOS transistor 43 (controlled by the second control signal Φ) and the first P-type MOS transistor 42 (controlled by the first control signal Φ−) are turned on and the second P-type MOS transistor 44 (controlled by the second control signal Φ) is turned off.

As the back gate electrode and the source electrode of the first P-type MOS transistor 42 are connected via the depletion type N-type MOS transistor 43, no potential difference is made. Therefore, as the rise of the threshold voltage of the first P-type MOS transistor 42 by back gate effect can be also prevented by intermediate potential generated in the resistor string circuit 14, the rise of the ON-state resistance is not caused as a result.

Further, as the threshold voltage of the depletion type N-type MOS transistor 43 is 0 V or less, no voltage drop for the threshold voltage occurs in the depletion type N-type MOS transistor 43. Therefore, the analog switching circuit 11-3 can output high-precision voltage.

That is, the analog switching circuit 11-3 can output high-precision voltage the ON-state resistance of which is small.

(2) In case the second control signal Φ is at a low level:

In case the second control signal Φ is at a low level, the second P-type MOS transistor 44 is turned on, and the first P-type MOS transistor 42 and the depletion type N-type MOS transistor 43 are turned off.

The back gate electrode of the first P-type MOS transistor 42 and the high potential power source are connected via the second P-type MOS transistor 44. Therefore, the potential of the source electrode of the first P-type MOS transistor 42 is never higher than that of the back gate electrode. Therefore, no leakage current flows.

Therefore, ON-state resistance is reduced and leakage current can be prevented. High-speed operation and operation by high-precision output voltage can be executed.

The number of elements is not increased and the similar control signal is used, compared with the conventional type. That is, the gradation selector circuit provided with the analog switching circuit the rise of the cost of the chip of which is inhibited and which has the characteristics described above can be realized.

Figure 5:
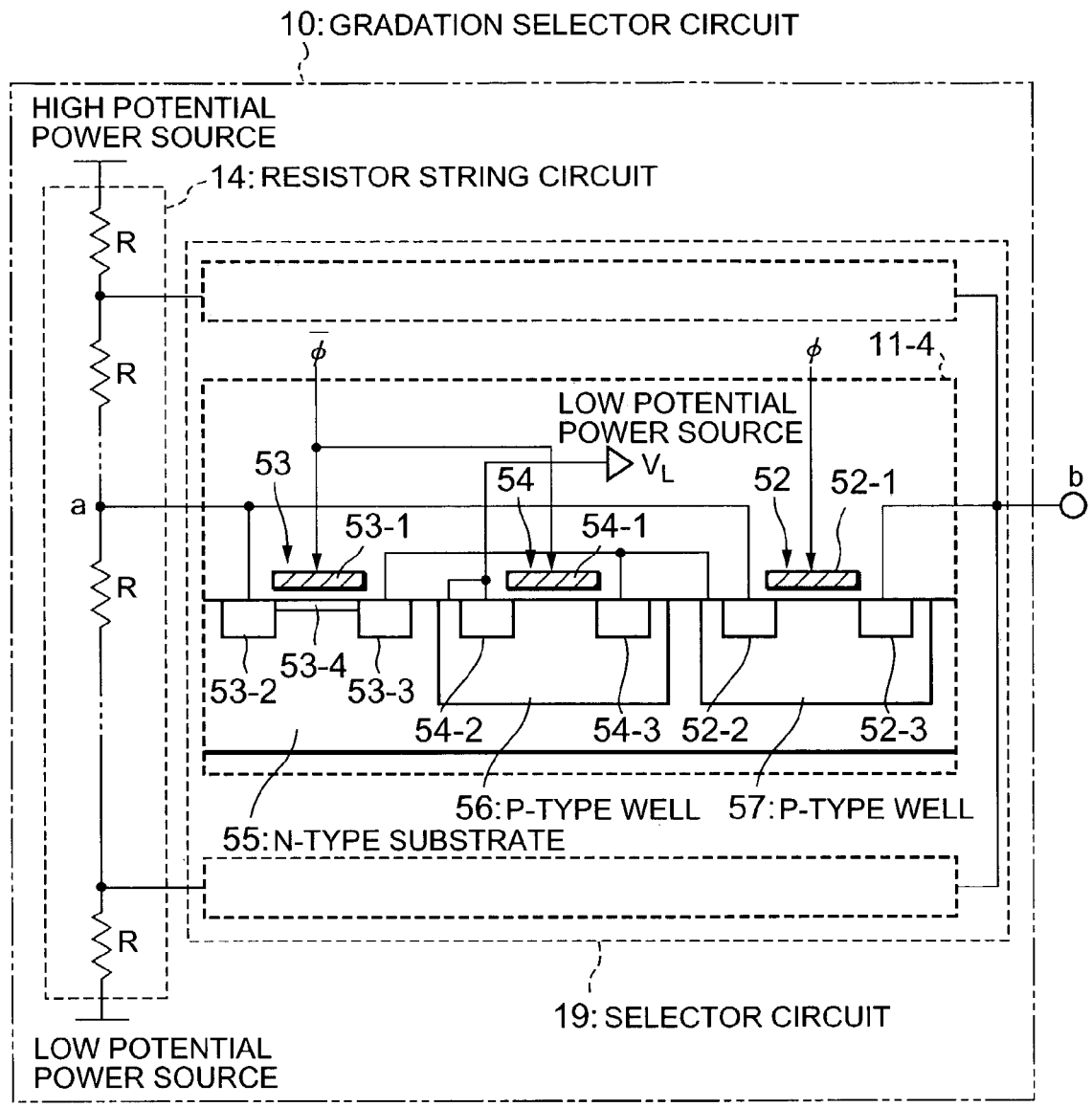
FIG. 5 mainly shows an analog switching circuit equivalent to a fourth embodiment of the invention.
Figure 6:
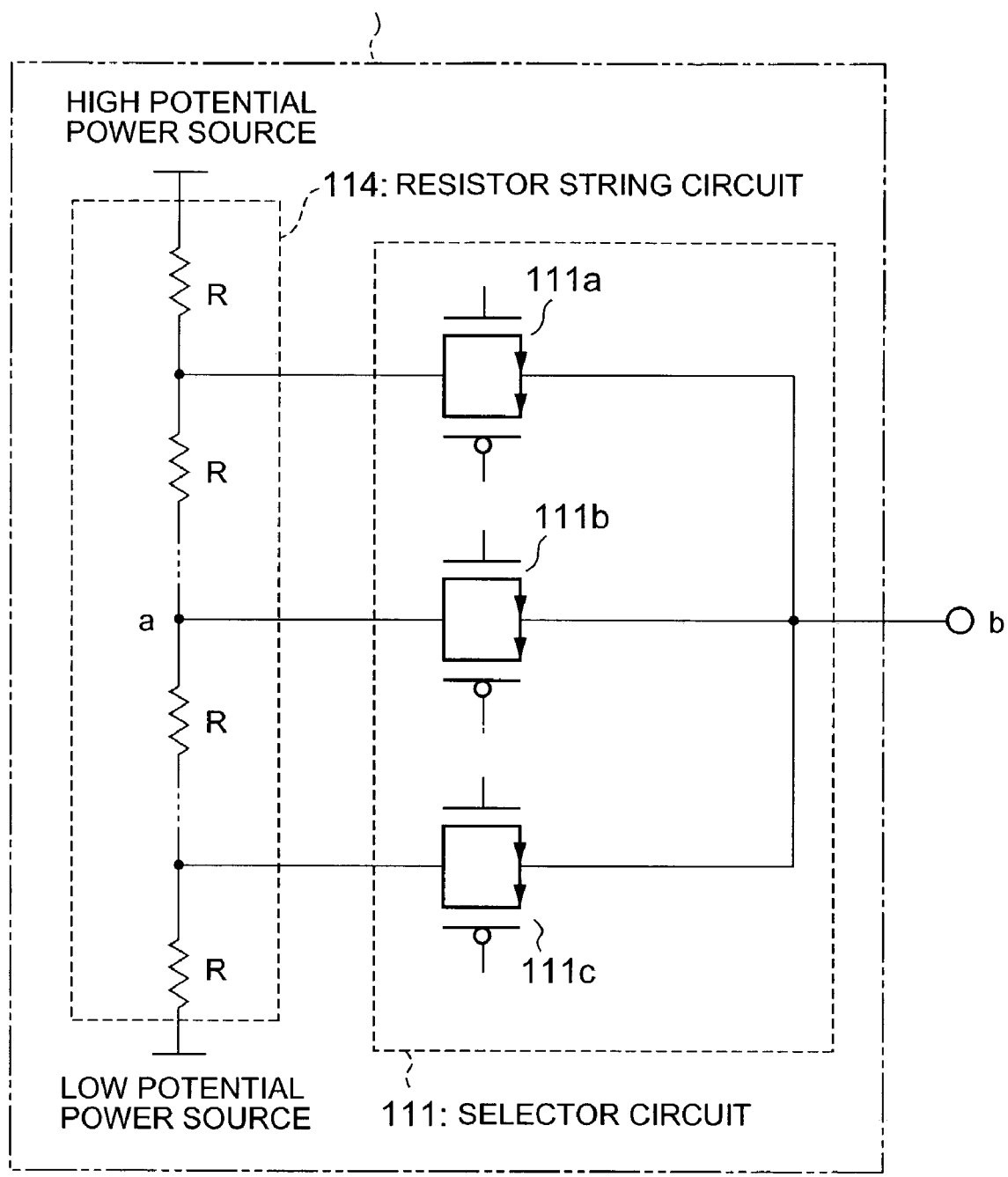
FIG. 6 is a circuit diagram showing the configuration of a conventional type gradation selector circuit.
Figure 7:
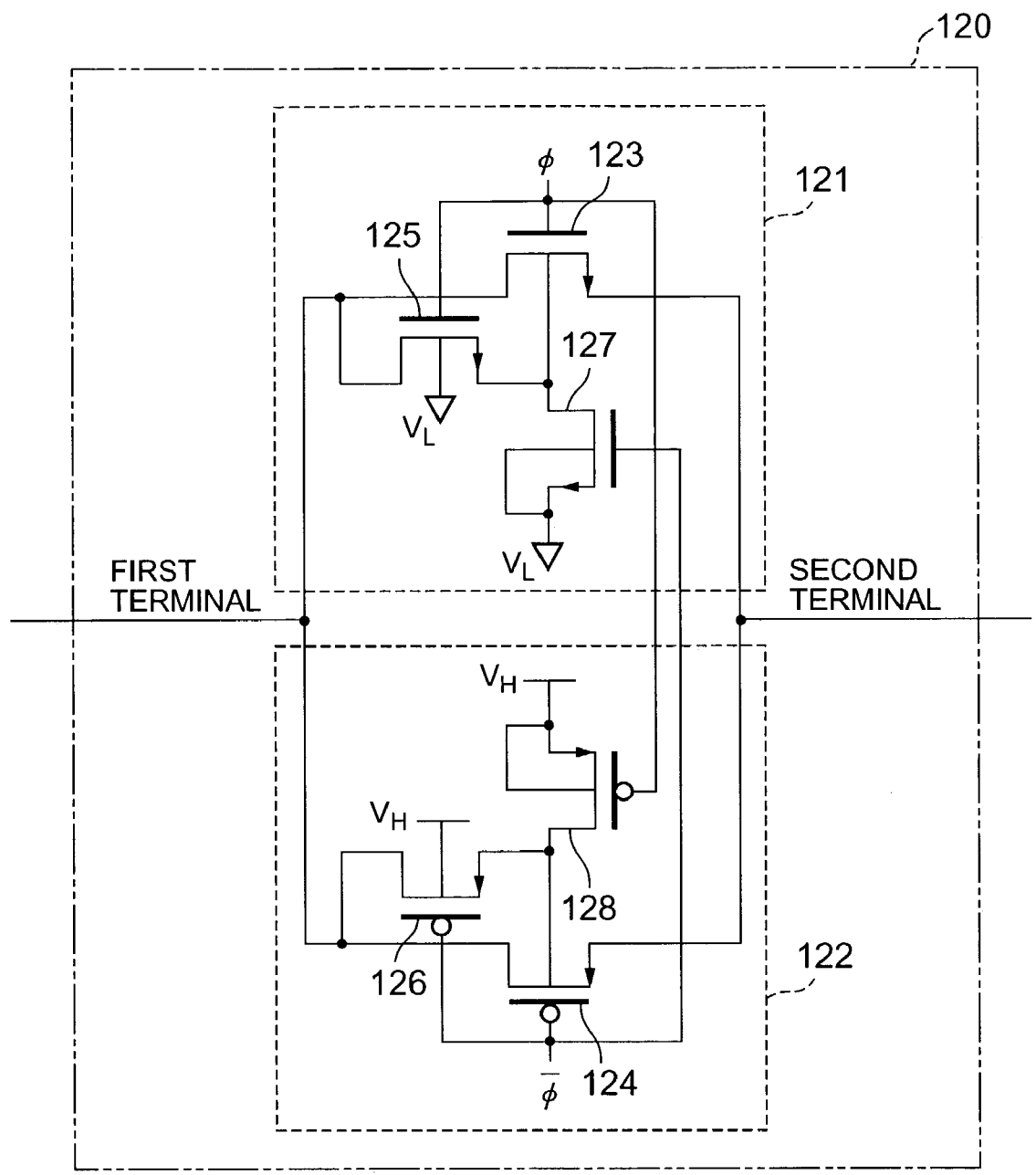
FIG. 7 is a circuit diagram showing a conventional type analog switching circuit used in the gradation selector circuit.

In case an N-type substrate is used for the P-type substrate in the analog switching circuit 11-3 shown in FIG. 4, the effect described above can be also similarly acquired. FIG. 5 shows the example as a fourth embodiment of the present invention.

FIG. 5 shows the gradation selector circuit 10 shown in FIG. 1 including the substantial cross section of one of plural analog switching circuits 11. The plural analog switching circuits 11 are analog switching circuits 11-4 (one analog switching circuit 11-4 is shown in FIG. 5) in case an N-type substrate is used in place of the P-type substrate used in the analog switching circuit 11-3 shown in FIG. 4.

An analog switching circuit 11-4 is provided with an enhancement type first N-type MOS transistor 52, a depletion type P-type MOS transistor 53 and an enhancement type second N-type MOS transistor 54.

For the first N-type MOS transistor 52, the source electrode (joined to a source 52-2) and the node a of the resistor string circuit 14 are connected. The drain electrode (joined to a drain 52-3) and an output terminal b are connected. A second control signal Φ is input to the gate electrode (joined to a gate 52-1).

For the depletion type P-type MOS transistor 53, the source electrode (joined to a source 53-2) and the node a of the resistor string circuit 14 are connected. The drain electrode (joined to a drain 53-3) and the back gate electrode (joined to a P-type well 57) of the first N-type MOS transistor 52 are connected. A first control signal Φ– which is an inverted signal (having reverse polarity) of the second control signal Φ is input to the gate electrode (joined to a gate 53-1).

For the second N-type MOS transistor 54, a low potential power source $V_L$ is connected to the source electrode (joined to a source 54-2) and the back gate electrode (joined to a P-type well 56), and the drain electrode (joined to a drain 54-3) and the back gate electrode of the first N-type MOS transistor 52 are connected. A first control signal Φ– is input to the gate electrode (joined to a gate 54-1).

The potential of the low potential power source $V_L$ shall be lower than minimum potential estimated as the potential of the source electrode of the first N-type MOS transistor 52 in case the first control signal Φ– is at a low level.

The description of the operation of the gradation selector circuit 10 shown in FIG. 5 is omitted because the fourth embodiment is the case that the N-type substrate is used in place of the P-type substrate shown in FIG. 4.

The gradation selector circuit of the present invention is characterized in that the ON-state resistance is low, no leakage current flows, high-speed operation is enabled and the precision of output voltage is high in a process in which the threshold voltage of a transistor is high and in case circuit design at low voltage is required can be realized by using the analog switching circuits (the analog switching circuits 11-1 to 11-4) according to the present invention particularly in case intermediate potential is output in the gradation selector circuit, inhibiting the increase of the cost of the chip.

That is, according to the invention, in the gradation selector circuit, the ON-state resistance is reduced, leakage current can be prevented, and high-speed operation and high-precision operation by output voltage can be executed.

What is claimed is:

1. A gradation selector circuit, comprising:
a resistor circuit in which a plurality of resistive elements are connected in series between a high potential power source and a low potential power source; and
a selector circuit connected to the resistor circuit, capable of selecting according to a control signal one of a plurality of analog voltages generated in the resistor circuit and outputting the selected analog voltage to an output terminal,
the selector circuit comprising a plurality of analog switching circuits, wherein each of the plurality of analog switching circuits corresponds to one of the plurality of analog voltages, and
wherein the analog switching circuit that selects one of the plurality of analog voltages having a potential substantially at the mid point of the potential between the high potential power source and the low potential power source comprises a transistor switch having at least one depletion mode transistor of one conductivity type in series with at least one enhancement mode transistor of another conductivity type between the resistor string circuit and the output terminal.

2. A gradation selector circuit, comprising:
a resistor circuit in which a plurality of resistive elements are connected in series between a high potential power source and a low potential power source; and
a selector circuit connected to the resistor circuit, capable of selecting according to a control signal one of a plurality of analog voltages generated in the resistor circuit and outputting the selected analog voltage to an output terminal,
the selector circuit comprising a plurality of analog switching circuits, wherein each of the plurality of analog switching circuits corresponds to one of the plurality of analog voltages, and
wherein the analog switching circuit that selects one of the plurality of analog voltages having a potential substantially at the mid point of the potential between the high potential power source and the low potential power source comprises:
a P-type insulated gate field effect transistor, wherein a back gate electrode and one of a source electrode and a drain electrode of the P-type insulated gate field effect transistor are connected to the resistor circuit, and a first control signal is input to a gate electrode of the P-type insulated gate field effect transistor and
a depletion type N-type insulated gate field effect transistor, wherein one of a source electrode and a drain electrode of the depletion type N-type insulated gate field effect transistor is connected to the other of the source electrode and the drain electrode of the P-type insulated gate field effect transistor, the other of the source electrode and the drain electrode of the depletion type N-type insulated gate field effect transistor is connected to the output terminal, and a second control signal complementary to the first control signal is input to a gate of the depletion type N-type insulated gate field effect transistor.

3. A gradation selector circuit according comprising:
a resistor circuit in which a plurality of resistive elements are connected in series between a high potential power source and a low potential power source; and
a selector circuit connected to the resistor circuit, capable of selecting according to a control signal one of a plurality of analog voltages generated in the resistor circuit and outputting the selected analog voltage to an output terminal,
the selector circuit comprising a plurality of analog switching circuits, wherein each of the plurality of analog switching circuits corresponds to one of the plurality of analog voltages, and
wherein the analog switching circuit that selects one of the plurality of analog voltages having a potential substantially at the mid point of the potential between the high potential power source and the low potential power source comprises:
an N-type insulated gate field effect transistor, wherein a back gate electrode and one of a source electrode and a drain electrode the N-type insulated gate field effect transistor are connected to the resistor circuit, and first control signal is input to a gate of the N-type insulated gate field effect transistor; and
a depletion type P-type insulated gate field effect transistor, wherein one of a source electrode and a drain electrode of the depletion type P-type insulated gate field effect transistor is connected to the other of the source electrode and the drain electrode of the N-type insulated gate field effect transistor, the other of the source electrode and the drain electrode of the depletion type P-type insulated gate field effect transistor is connected to the output terminal, and a second control signal complementary to the first control signal is input to a gate of the depletion type P-type insulated gate field effect transistor.

4. A gradation selector circuit comprising:

a resistor circuit in which a plurality of resistive elements are connected in series between a high potential power source and a low potential power source; and a selector circuit connected to the resistor circuit, capable of selecting according to a control signal one of a plurality of analog voltages generated in the resistor circuit and outputting the selected analog voltage to an output terminal, the selector circuit comprising a plurality of analog switching circuits, wherein each of the plurality of analog switching circuits corresponds to one of the plurality of analog voltages, and wherein the analog switching circuit that selects one of the plurality of analog voltages having a potential substantially at the mid point of the potential between the high potential power source and the low potential power source comprises:

a first P-type insulated gate field effect transistor, wherein one of a source electrode and a drain electrode of the first P-type insulated gate field effect transistor is connected to the resistor circuit, the other of the source electrode and the drain electrode of the first P-type insulated gate field effect transistor is connected to the output terminal, and a first control signal is input to a gate of the first P-type insulated gate field effect transistor;

a depletion type N-type insulated gate field effect transistor, wherein one of a source electrode and a drain electrode of the depletion type N-type insulated gate field effect transistor is connected to the resistor circuit, the other of the source electrode and the drain electrode of the depletion type N-type insulated gate field effect transistor is connected to a back gate electrode of the first P-type insulated gate field effect transistors, and a second control signal complementary to the first control signal is input to a gate of the depletion type N-type insulated gate field effect transistor; and a second P-type insulated gate field effect transistor, wherein a back gate electrode and one of a source electrode and a drain electrode of the second P-type insulated gate field effect transistor are connected to the high potential power source, the other of the source electrode and the drain electrode of the second P-type insulated gate field effect transistor is connected to the back gate electrode of the first P-type insulated gate field effect transistor, and the second control signal is input to a gate electrode of the second P-type insulated gate field effect transistor.

5. A gradation selector circuit comprising:

a resistor circuit in which a plurality of resistive elements are connected in series between a high potential power source and a low potential power source; and a selector circuit connected to the resistor circuit, capable of selecting according to a control signal one of a plurality of analog voltages generated in the resistor circuit and outputting the selected analog voltage to an output terminal, the selector circuit comprising a plurality of analog switching circuits, wherein each of the plurality of analog switching circuits corresponds to one of the plurality of analog voltages, and wherein the analog switching circuit that selects one of the plurality of analog voltages having a potential substantially at the mid point of the potential between the high potential power source and the low potential power source comprises:

a first N-type insulated gate field effect transistor, wherein one of a source electrode and a drain electrode of the first N-type insulated gate field effect transistor is connected to the resistor circuit, the other of the source electrode and the drain electrode of the first N-type insulated gate field effect transistor is connected to the output terminal, and a first control signal is input to a gate of the first N-type insulated gate field effect transistor;

a depletion type P-type insulated gate field effect transistor, wherein one of a source electrode and a drain electrode of the depletion type P-type insulated gate field effect transistor is connected to the resistor circuit, the other of the source electrode and the drain electrode of the depletion type P-type insulated gate field effect transistor is connected to a back gate electrode of the first N-type insulated gate field effect transistor, and a second control signal complementary to the first control signal is input to a gate of the depletion type P-type insulated gate field effect transistor; and a second N-type insulated gate field effect transistor, wherein a back gate electrode and one of a source electrode and a drain electrode of the second N-type insulated gate field effect transistor connected to the low potential power source, the other of the source electrode and the drain electrode of the second N-type insulated gate field effect transistor is connected to a back gate electrode of the first N-type insulated gate field effect transistor, and the second control signal is input to a gate of the second N-type insulated gate field effect transistor.

6. A gradation selector circuit, comprising:

a resistor circuit having a plurality of resistive elements in series between a first power source and a second power source; and a selector circuit including a plurality of switch circuits coupled in common to an output terminal, wherein:

a first switch circuit of the plurality of switch circuits having a first transistor of a first conductivity type and a second transistor of a second conductivity type, wherein said first and second transistors of said first switch circuit are connected in parallel between said resistor circuit and said output terminal, a second switch circuit of the plurality of switch circuits having a first transistor of the conductivity type and a second transistor of the second first conductivity type, wherein said first and second transistors of connected in parallel between said resistor circuit and said output terminal, and a third switch circuit of the plurality of switch circuits having a first transistor of the first conductivity type and a second transistor of the second conductivity type, wherein said first and second transistors of said third switch circuit are connected in series between said resistor circuit and said output terminal.

7. The gradation selector circuit as claimed in claim 6, wherein said second transistor of said third switch circuit is a depletion type.

8. The gradation selector circuit as claimed in claim 7, wherein said first transistor of said third switch circuit has a source electrode and a back gate coupled in common to said resistor circuit.

9. A gradation selector circuit, comprising:
a resistor circuit having a first node and a second node;
a first switch circuit coupled between said first node and an output terminal; and
a second switch circuit including a depletion transistor of a first conductivity type and an enhancement transistor of a second conductivity type different from the first conductivity type, said depletion transistor and enhancement transistor being coupled in series between said second node and said output terminal.

10. The gradation selector circuit according to claim 9, wherein said first switch circuit includes a first transistor of said first conductivity type and a second transistor of said second conductivity type, said first and second transistors being connected in parallel with each other.

11. The gradation selector circuit according to claim 10, wherein said enhancement transistor has an electrode and a back gate coupled in common to said second node.

12. The gradation selector circuit according to claim 11, wherein said electrode is directly connected to said second node.

13. The gradation selector circuit according to claim 11, wherein said depletion transistor is connected between said second node and said enhancement transistor.

14. The gradation selector circuit according to claim 13, further comprising a third transistor of said second conductivity type coupled to said depletion and enhancement transistors.

* * * * *